United States Patent
Cai et al.

(10) Patent No.: US 9,218,885 B2
(45) Date of Patent: Dec. 22, 2015

(54) SYSTEM TO CONTROL A WIDTH OF A PROGRAMMING THRESHOLD VOLTAGE DISTRIBUTION WIDTH WHEN WRITING HOT-READ DATA

(71) Applicant: Seagate Technology LLC, Cupertino, CA (US)

(72) Inventors: Yu Cai, San Jose, CA (US); Yunxiang Wu, Cupertino, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 66 days.

(21) Appl. No.: 14/191,263

(22) Filed: Feb. 26, 2014

(65) Prior Publication Data

US 2015/0235705 A1 Aug. 20, 2015

Related U.S. Application Data

(60) Provisional application No. 61/940,561, filed on Feb. 17, 2014.

(51) Int. Cl.
*G11C 16/28* (2006.01)
*G11C 16/10* (2006.01)
*G11C 11/56* (2006.01)

(52) U.S. Cl.
CPC .............. *G11C 16/10* (2013.01); *G11C 16/28* (2013.01); *G11C 11/5642* (2013.01); *G11C 2211/5634* (2013.01)

(58) Field of Classification Search
CPC .............. G11C 16/28; G11C 11/5642; G11C 2211/5634
USPC ................ 365/185.2, 189.14, 185.15, 185.16
See application file for complete search history.

(56) References Cited

U.S. PATENT DOCUMENTS

| | | | |
|---|---|---|---|
| 8,248,856 B2 * | 8/2012 | Goss ........................ | G11C 7/04 365/185.2 |
| 8,631,294 B2 | 1/2014 | Kankani et al. ............... | 714/738 |
| 2012/0239858 A1 | 9/2012 | Melik-Martirosian ....... | 711/103 |
| 2013/0208543 A1 | 8/2013 | Park ......................... | 365/185.19 |
| 2013/0301352 A1 | 11/2013 | Shim et al. ................ | 365/185.03 |
| 2014/0006688 A1 | 1/2014 | Yu et al. ........................ | 711/103 |
| 2014/0010026 A1 | 1/2014 | Kim et al. .................. | 365/189.07 |
| 2014/0022842 A1 | 1/2014 | Jung et al. ................. | 365/185.03 |
| 2014/0026003 A1 | 1/2014 | Chen et al. ................... | 714/708 |
| 2014/0029342 A1 | 1/2014 | Huang et al. ............. | 365/185.12 |
| 2014/0032821 A1 | 1/2014 | Lee et al. ..................... | 711/103 |

OTHER PUBLICATIONS

Pan, Yangyan, et al., "Quasi-Nonvolatile SSD: Trading Flash Memory Nonvolatility to Improve Storage System Performance for Enterprise Applications", 2011 IEEE, 9 pages.

* cited by examiner

*Primary Examiner* — Jason Lappas
(74) *Attorney, Agent, or Firm* — Christopher P. Maiorana, PC

(57) ABSTRACT

An apparatus comprising a memory and a controller. The memory is configured to process a plurality of read/write operations. The memory comprises a plurality of memory modules. Each memory module has a size less than a total size of the memory. The controller is configured to write user data using a plurality of threshold voltages. The data considered hot-read data is written using a first voltage threshold. The data not considered hot-read data is written using a second voltage threshold. The first voltage threshold reduces an impact on endurance of the memory.

15 Claims, 4 Drawing Sheets

SYSTEM TO CONTROL A WIDTH OF A PROGRAMMING THRESHOLD VOLTAGE DISTRIBUTION WIDTH WHEN WRITING HOT-READ DATA

This application relates to U.S. Provisional Application No. 61/940,561, filed Feb. 17, 2014, which is hereby incorporated by reference in its entirety.

FIELD OF THE INVENTION

The invention relates to data storage generally and, more particularly, to a method and/or apparatus for controlling a width of a programming threshold voltage distribution when writing hot-read data in a memory storage device.

BACKGROUND

The threshold voltage distribution of NAND flash memory can be controlled to be narrow (i.e., a small variance) or wide (i.e., a large variance). A narrow variance will increase the signal-to-noise ratio and reduce the raw bit error rate during read operations. Less read retries and less error correction code (ECC) decoding iterations will be needed and will improve the read performance. However, by controlling distribution width, program operations will be slowed down. There will be a tradeoff of system performance between read and program operations. In a typical system, some of the data are read more frequently than others. Frequently read data is referred to as hot-read data. Less frequently read data is not hot-read data. The total system operations is the sum of one program operation and multiple read operations.

SUMMARY

The invention concerns an apparatus comprising a memory and a controller. The memory is configured to process a plurality of read/write operations. The memory comprises a plurality of memory modules. Each memory module has a size less than a total size of the memory. The controller is configured to write user data using a plurality of threshold voltages. The data considered hot-read data is written using a first voltage threshold. The data not considered hot-read data is written using a second voltage threshold. The first voltage threshold reduces an impact on endurance of the memory.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include controlling a programming voltage that may (i) provide a particular threshold voltage distribution width when writing hot-read data, (ii) improve system performance, (iii) provide slow programming of flash memory for hot-read data during idle times, (iv) improve memory endurance, (v) control a distribution width of a threshold voltage, (vi) reduce ECC decoding latency, (vii) save latency/power for a read operation of hot-read data, (viii) improve performance when the data are read thousands/millions of times and/or (ix) be implemented as one or more integrated circuits.

Figure 1:
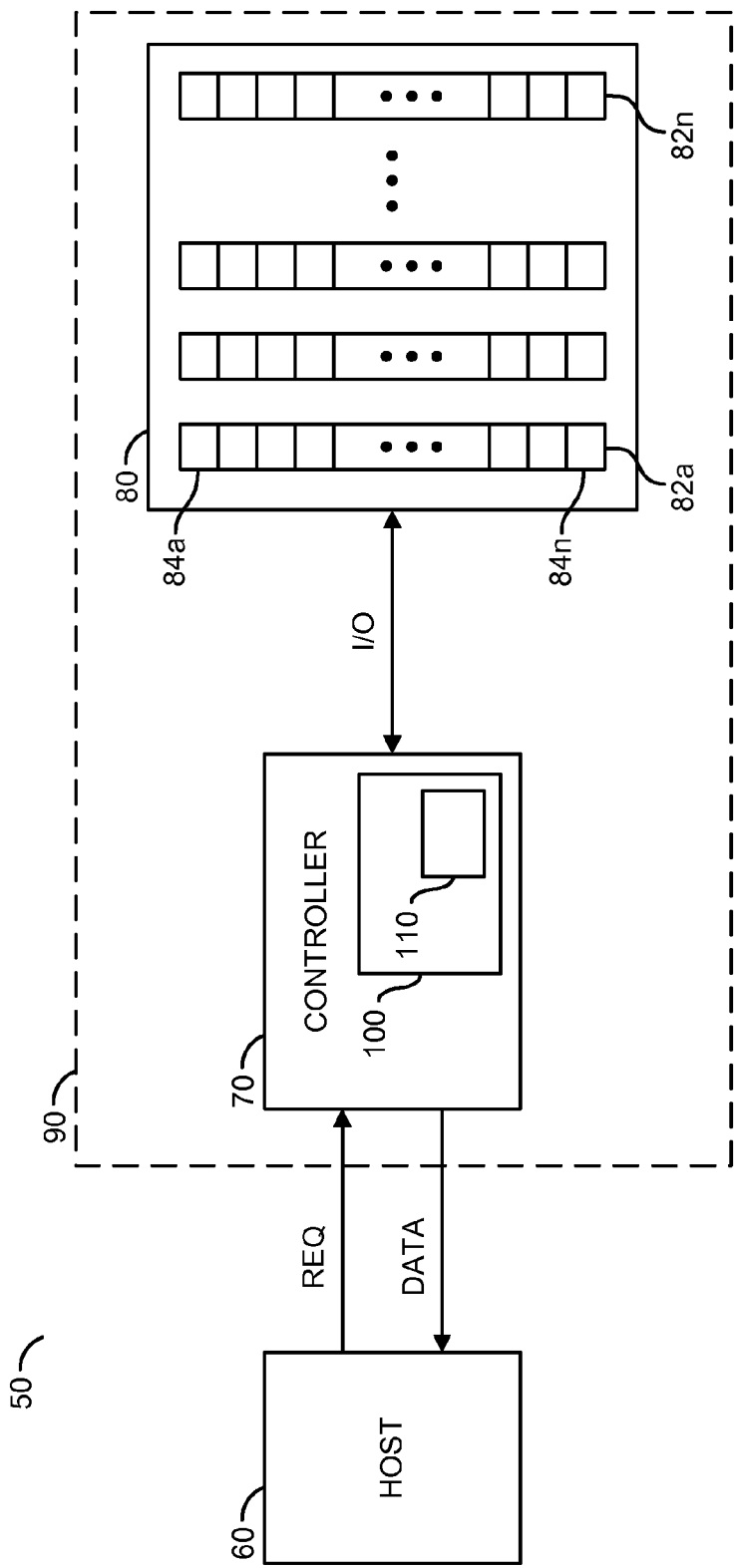
FIG. 1 is a diagram illustrating an example embodiment.

Referring to FIG. 1, a block diagram of an example apparatus 50 is shown. The apparatus 50 generally comprises a block (or circuit) 60, a block (or circuit) 70 and a block (or circuit) 80. The circuit 70 may include a circuit 100. The circuit 100 may be a memory/processor configured to store computer instructions (or firmware) or may be logic. The instructions, when executed, may perform a number of steps. The firmware 100 may include a redundancy control module 110. The redundancy control module 110 may be implemented as part of the firmware 100 or as a separate module. While an example of redundancy implemented in the firmware 100 is shown, the redundancy may be implemented, in another example, in hardware (e.g., logic such as a state machine).

A signal (e.g., REQ) may be generated by the circuit 60. The signal REQ may be received by the circuit 70. The signal REQ may be a request signal that may be used to access data from the circuit 80. A signal (e.g., I/O) may be generated by the circuit 70 to be presented to/from the circuit 80. The signal REQ may include one or more address bits. A signal (e.g., DATA) may be one or more data portions received by the circuit 60.

The circuit 60 is shown implemented as a host circuit. The circuit 70 reads and writes data to and from the circuit 80. The circuit 80 is generally implemented as a nonvolatile memory circuit. The circuit 80 may include a number of modules 82a-82n. The modules 82a-82n may be implemented as NAND flash chips. In some embodiments, the circuit 80 may be a NAND flash device. In other embodiments, the circuit 70 and/or the circuit 80 may be implemented as all or a portion of a solid state drive 90 having one or more nonvolatile devices. The circuit 80 is generally operational to store data in a nonvolatile condition. When data is read from the circuit 80, the circuit 70 may access a set of data (e.g., multiple bits) identified in the signal REQ. The signal REQ may request data from the drive 90 or from one of a number of additional storage devices.

Data within the circuit 80 is generally organized in a hierarchy of units. A first type of redundancy may be implemented as a redundancy block. A redundancy block is a combination of blocks (e.g., a block from each nonvolatile memory die in the circuit 80) that can be combined to form a redundant array of silicon independent elements, similar to a redundant array of independent disks for magnetic media. The nonvolatile memory locations within the blocks may be written in a striped fashion. In some embodiments, organizing a plurality of blocks in redundancy blocks reduces an overhead of block management. A block is generally considered a smallest quantum of erasing. A page is generally considered a smallest quantum of writing. A read unit (or codeword or Epage or ECC-page) is a smallest correctable quantum of reading and/or error correction. Each block includes an integer number of pages. Each page includes an integer number of read units.

In some embodiments, the circuit 80 may be implemented as a single-level cell (e.g., SLC) type circuit. An SLC type circuit generally stores a single bit per memory cell (e.g., a logical 0 or 1). In other embodiments, the circuit 80 may be implemented as a multi-level cell (e.g., MLC) type circuit. An MLC type circuit is generally capable of storing multiple (e.g., two) bits per memory cell (e.g., logical 00, 01, 10 or 11). In still other embodiments, the circuit 80 may implement a triple-level cell (e.g., TLC) type circuit. A TLC circuit may be able to store multiple (e.g., three) bits per memory cell (e.g., a logical 000, 001, 010, 011, 100, 101, 110 or 111).

In general, the controller 70 may include an erase/program unit that may implement redundancy across the modules 82a-82n. For example, multiple blocks may be read from multiple dies 82a-82n. The erase/program unit may be implemented as part of the firmware (or logic) 100.

The drive 90 may contain, in one example, multiple NAND Flash or memory modules 82a-82n. Each of the memory modules may be fabricated as one or more dies (e.g., 1, 2, 4, 8, etc.). The dies (or modules) 82a-82n may operate to read or to write concurrently. The read and write bandwidth depends on how many of the dies 82a-82n are implemented, as well as the bandwidth of each of the dies 82a-82n. Each of the dies 82a-82n may contain a plurality of pages 84a-84n. If the SSD drive 90 receives the host command REQ, in order to achieve the best performance, and/or to address wear leveling issues, the drive 90 will walk through all of the dies 82a-82n (e.g., a first page of DIE0, DIE1 ... DIEn, then a next page of DIE0).

To program the memory cells in the modules 82a-82n, a threshold voltage (e.g., $V_{TH}$) may need to reach a predetermined target voltage. The threshold voltage $V_{TH}$ may have a distribution width. The distribution width of the threshold voltage $V_{TH}$ may be controlled in increments of a step size (e.g., $\Delta V$). In one example, the threshold voltage $V_{TH}$ may reach the predetermined target voltage and have a narrow distribution width. Generally, the threshold voltage $V_{TH}$ will have a narrow distribution width if the step size $\Delta V$ is small. When the threshold voltage $V_{TH}$ reaches the predetermined target voltage with a narrow distribution width, an impact on endurance of the memory may be reduced. A threshold voltage $V_{TH}$ with a narrow distribution width may also result in faster reads, fewer read retries, power savings, and/or reducing the frequency of data recycling. In another example, the threshold voltage $V_{TH}$ may reach the predetermined target voltage and have a wide distribution width. Generally, the threshold voltage $V_{TH}$ will have a wide distribution width if the step size $\Delta V$ is large. When the threshold voltage $V_{TH}$ reaches the predetermined target voltage with a wide distribution width, an impact on endurance of the memory 80 may not be reduced.

In one embodiment, the hotness (e.g., how frequently data is accessed) of the data to be read from the drive 90 may be tracked. If the data is hot (e.g., frequently accessed), the distribution width may be controlled to implement slow programming. For hot-read data, the overall performance tends to be dominated by read operations. Control of the distribution width for hot-read data may significantly improve system performance. Such control of hot-read data may be used during an idle time of the solid state drive (SSD) 90 to mitigate program slowdown. Such an idle time may be useful especially when (1) hot-read data are recycled during garbage collection and (2) hot-read data are reprogrammed when the SSD 90 is idle. In addition to system performance improvement, read disturb errors may be reduced. The recycle frequency of hot-read data due to read disturb may also be reduced.

Figure 2:
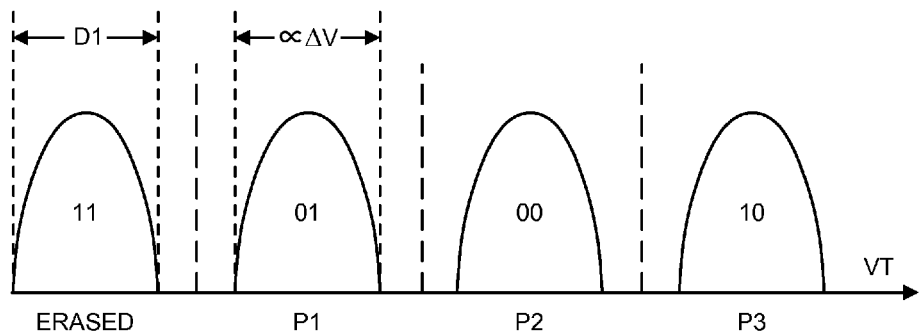
FIG. 2 is a diagram illustrating an example of a narrow distribution of programming voltage thresholds.

Referring to FIG. 2, a diagram illustrating a first programming voltage is shown. A voltage threshold with a narrow distribution width is shown. A distribution width (e.g., D1) may be controlled by the step size $\Delta V$. The step size $\Delta V$ may be the increase of the threshold voltage $V_{TH}$ during each iteration of an incremental step pulse programming (ISPP) method (described in more detail in connection with FIG. 5). The distribution width D1 is shown to be proportional to a small step size $\Delta V$. If the step size $\Delta V$ is small, the distribution width D1 may be narrow. The distribution width D1 may tend towards the step size $\Delta V$ after multiple ISPP iterations. The size of the final distribution width of D1 may be correlated to the small step size $\Delta V$. A narrow distribution width may result in fewer read errors. Fewer read errors may result in fewer read retries and/or fewer iterations of low density parity check (LDPC) decoding. Fewer retries may increase the endurance of the drive 90. A narrow distribution may also result in fast reads. However, programming a narrow distribution width may be slower than programming with a typical distribution. For example, programming with a smaller step size $\Delta V$ may take more steps for the threshold voltage of the flash cells in each of the pages 84a-84n to reach a particular target level. The result may be slower programming of the memory 80.

Figure 3:
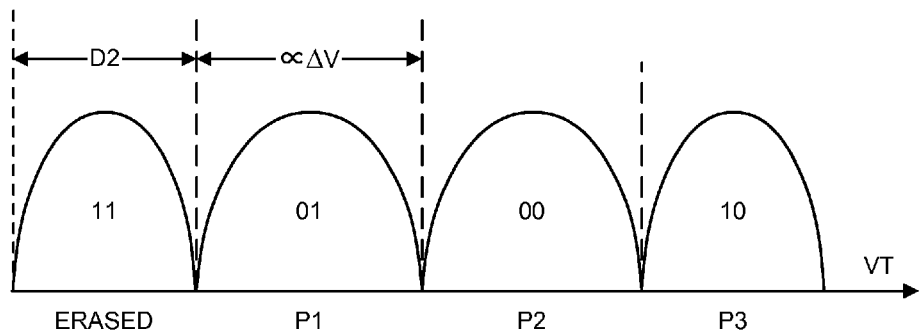
FIG. 3 is a diagram illustrating an example of a wide distribution of programming voltage thresholds.

Referring to FIG. 3, a diagram illustrating an example of a second programming voltage is shown. A voltage threshold with a wide distribution (e.g., D2) is shown. The step size $\Delta V$ is shown to be large. The step size $\Delta V$ may be the increase of the threshold voltage $V_{TH}$ during each iteration of an incremental step pulse programming (ISPP) method (described in more detail in connection with FIG. 5). The distribution width D2 is shown to be proportional to the large step size $\Delta V$. If the step size $\Delta V$ is large, the width of the distribution D2 may be wider. The distribution width D2 may tend towards the step size $\Delta V$ after multiple ISPP iterations. The size of the final distribution width of D2 may be correlated to the large step size $\Delta W$. With a larger step size $\Delta V$, fewer steps may be needed for the threshold voltage of the flash cells to reach a target level. Programming using a large step size value $\Delta V$ may be faster than programming using a smaller step size value. However, a wide voltage width distribution may not have the benefits of a narrow voltage width distribution (e.g., fewer read errors, fewer read retries, etc.).

Figure 4:
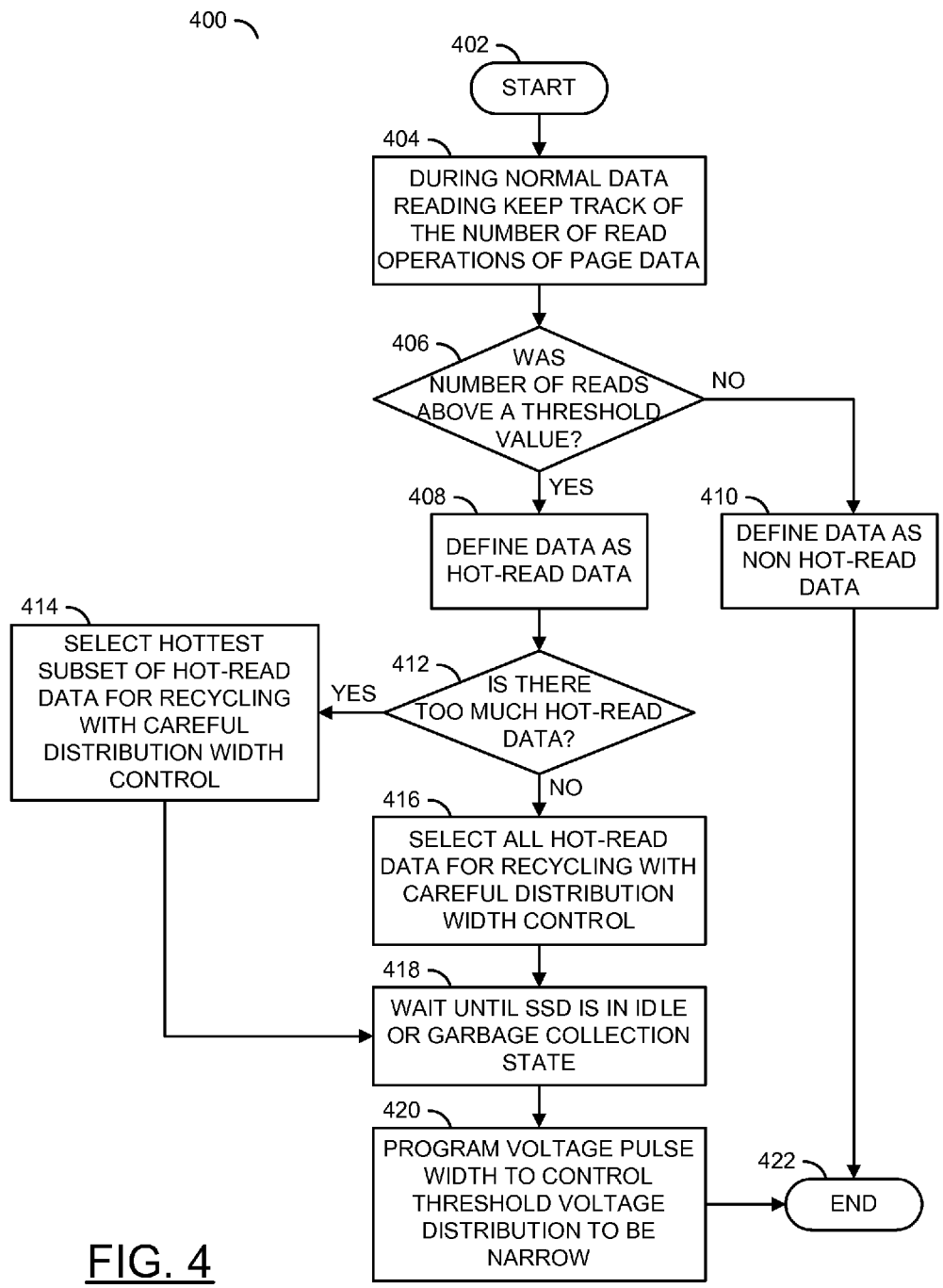
FIG. 4 is a flow diagram illustrating selecting data for distribution width control.

Referring to FIG. 4, a method 400 is shown. The method 400 may select data for recycling and/or distribution width control. The method 400 generally comprises a step (or state) 402, a step (or state) 404, a decision step (or state) 406, a step (or state) 408, a step (or state) 410, a decision step (or state) 412, a step (or state) 414, a step (or state) 416, a step (or state) 418, a step (or state) 420, and a step (or state) 422. The state 402 may start the method 400. Next, the state 404 may keep track of the number of read operations of page data (e.g., data stored in the pages 84a-84n) during normal data reading. Next, the method 400 may move to the decision state 406. The decision state 406 may determine whether the number of reads is above a threshold value. If not, the state 410 may define the data as non hot-read data. Non hot-read data may be data other than hot-read data. Next, the method 400 may move to the state 422. In the decision state 406, if the method 400 determines the number of reads is above a threshold value, the method 400 moves to the state 408. The state 408 may define the data as hot-read data.

Next, the decision state 412 may determine if there is too much hot-read data. If there is too much hot-read data, the method 400 moves to the state 414. The state 414 may select the hottest subset of hot-read data for recycling with careful distribution width control. The method 400 may then move to the state 418. In the decision state 412, if the method 400 determines there is not too much hot-read data, the method 400 may move to the state 416. The state 416 may select all hot-read data for recycling with careful distribution width control. Next, the state 418 may wait until the SSD drive 90 is in an idle and/or garbage collection state. Next, the method 400 may move to the state 420. The state 420 may program voltage pulse width to control the threshold voltage V, distribution to be narrow. The data may be read and/or reprogrammed to another location. The programming may be performed slowly by controlling the program step size ΔV, controlling the program pulse voltage and/or programming the voltage pulse width to control the threshold voltage $V_{TH}$ distribution of hot-read data to be narrow. Next, the method may move to the state 422. The state 422 may end the method 400.

The distribution width of the threshold voltage $V_{TH}$ may be controlled for any data that may reduce the sum of program time and multiple read time. In one example, an embodiment of the invention may be applied when the SSD drive 90 is in an idle state. In another example, an embodiment of the invention may be applied when the SSD drive 90 is in a garbage collection state. Generally, a slower program process may not affect the performance of the SSD drive 90 during an idle state and/or a garbage collection state. Other suitable states (e.g., during self-triggered data recycling), of the SSD drive 90 may be selected to perform hot-read data recycling and/or reprogramming according to the design metrics of a particular implementation. Generally, a time for hot-read data recycling and/or reprogramming may be selected to limit the impact on performance of the SSD drive 90. If the hot-read data is read during a re-program, original copies of the data in the original locations may still be read to satisfy requests by the host 60.

If data is frequently read, it may be considered hot-read data. For hot-read data, the data may be programmed slowly to control the distribution of the threshold voltage $V_{TH}$ to be narrow. The threshold voltage $V_{TH}$ may be programmed slowly by programming the data with smaller step size ΔV, smaller program voltage, and/or smaller program voltage pulse width. Data programmed using a narrow distribution width may be read faster with less energy. Data that is not frequently read (e.g., non hot-read data) may be programmed using conventional methods.

Figure 5:
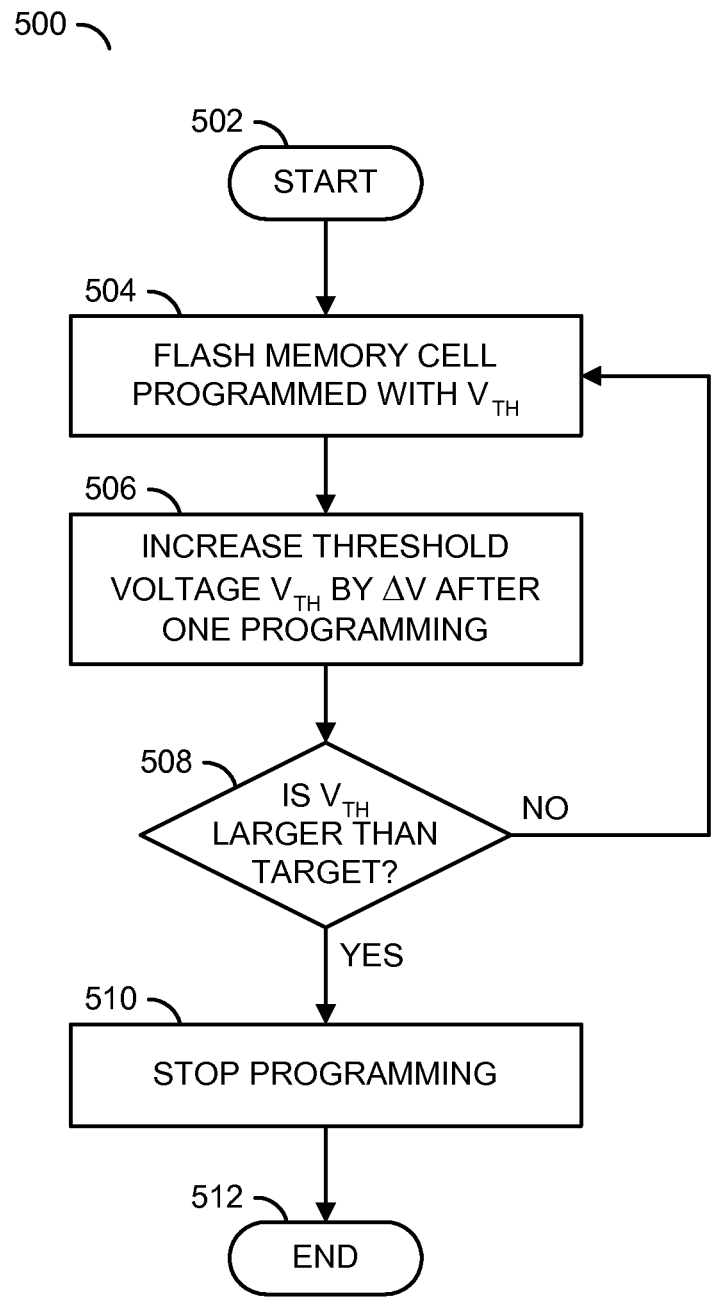
FIG. 5 is a flow diagram illustrating incremental step pulse programming.

Referring to FIG. 5, a method (or process) 500 is shown. The method 500 may implement incremental step pulse programming (ISPP). Flash memory cells in the memory modules 82*a*-82*n* may be programmed with incremental step pulse programming. The method 500 generally comprises a step (or state) 502, a step (or state) 504, a step (or state) 506, a decision step (or state) 508, a step (or state) 510, and a step (or state) 512. The state 502 may start the method 500. Next, the method 500 may move to the state 504. The state 504 may program a flash memory cell with the threshold voltage $V_{TH}$. Next, the state 506 may increase the threshold voltage $V_{TH}$ by the step size ΔV after one programming. The method 500 may move to the decision state 508. In the decision state 508, the method 500 may determine whether the threshold voltage $V_{TH}$ is larger than a predefined target voltage. If not, the method 500 may move to the state 504. If the threshold voltage $V_{TH}$ is larger than the target voltage, the method 500 may move to the state 510. The state 510 may stop programming the flash memory cell. Next, the method 500 may move to the state 512. The state 512 may end the method 500.

Performance metrics of the SSD drive 90 may include read time and/or program speed. Raw flash read time (e.g., RawFlashRead) may be determined by setting a read reference voltage and reading the data (e.g., FlashReadTime). A read operation may involve many read retries (e.g., ReadRetries). Multiple read operations may be needed for reading a page 84*a*-84*n*. The raw flash read time may be a product of ReadRetries and FlashReadTime. Total read time may also include an ECC decoding latency (e.g., ECCDecodingLatency). The ECC decoding latency may have a decoding time (e.g., DecodingTime). The ECC decoding may need multiple iterations (e.g., IterationNum). The ECC decoding latency may be a product of IterationNum and DecodingTime. An example of the total read time may be determined by the formula:

Total Read Time=ECCDecodingLatency+RawFlashRead where,

ECCDecodingLatency=IterationNum×DecodingTime and

RawFlashRead=ReadRetries×FlashReadTime

Program speed may correlate with the step size ΔV. For example, total program speed may be proportional to K×ΔV (e.g., ProgramTime) where K is the number of program steps. The number of program steps K may be the number of iterations needed to reach the target voltage in the ISPP method 500 described in FIG. 5.

Generally, page data (e.g., data stored in the pages 84*a*-84*n*) may be programmed once and read multiple times. The total process time for a page of data may be defined by the formula:

Total Process Time=1×ProgramTime+N×Total Read Time

If the product of the total read time and N is large, read time may be a bottleneck of system performance of the SSD drive 90.

Benefits of a narrow distribution width of the threshold voltage $V_{TH}$ may include fast reads as a result of fewer read retries and/or less ECC decoding latency. Narrower distributions may reduce read disturb errors. Fewer read disturb errors may result in hot-read data being recycled less frequently. Since hot-read data is read multiple times (e.g., thousands or millions of times), even small savings in latency and/or power for each read operation may significantly improve the overall performance of the SSD drive 90.

The functions performed by the diagrams of FIGS. 4 and 5 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a memory configured to store data, the memory comprising a plurality of memory modules each having a size less than a total size of the memory; and
a controller configured to (A) process a plurality of read/write operations and (B) write the data using a plurality of threshold voltages, wherein (i) data considered hot-read data is written using a first voltage threshold, (ii) data not considered hot-read data is written using a second voltage threshold, and (iii) the first voltage threshold reduces an impact on endurance of the memory.

2. The apparatus according to claim 1, wherein the first voltage threshold results in faster reads, fewer read retries, less recycling of hot-read data, and saves power when reading from the memory.

3. The apparatus according to claim 1, wherein the threshold voltages are implemented using incremental step pulse programming.

4. The apparatus according to claim 1, wherein a voltage pulse width distribution of the first voltage threshold is narrower than a voltage pulse width distribution of the second voltage threshold.

5. The apparatus according to claim 1, wherein the first voltage threshold is generated using slow programming.

6. The apparatus according to claim 5, wherein the slow programming of the memory occurs during an idle time.

7. The apparatus according to claim 5, wherein the slow programming of the memory occurs during a garbage collection state.

8. The apparatus according to claim 5, wherein the slow programming of the memory occurs during a data recycling state.

9. The apparatus according to claim 5, wherein the slow programming does not affect the performance of the apparatus.

10. The apparatus according to claim 5, wherein the data is read from an original location if the hot-read data is read during the slow programming.

11. The apparatus according to claim 1, wherein the controller calculates the hot-read data by keeping track of a number of read operations on the memory during data reading operations and determines if the number of read operations is above a threshold value.

12. The apparatus according to claim 11, wherein the data is classified as hot-read data if the number of read operations is above the threshold value and is classified as non hot-read data if the number of read operations is not above the threshold value.

13. The apparatus according to claim 11, wherein the controller selects the hottest subset of hot-read data for recycling with distribution width control when hot-read data is above a predetermined amount.

14. A method for controlling a solid state drive, comprising the steps of:
configuring a memory to store data, the memory comprising a plurality of memory modules each having a size less than a total size of the memory;
processing a plurality of read/write operations; and
writing the data using a plurality of threshold voltages, wherein (i) data considered hot-read data is written using a first voltage threshold, (ii) data not considered hot-read data is written using a second voltage threshold, and (iii) the first voltage threshold reduces an impact on endurance of the memory.

15. An apparatus comprising:
a memory configured to store data, the memory comprising a plurality of memory modules each having a size less than a total size of the memory; and
means for (A) processing a plurality of read/write operations and (B) writing the data using a plurality of threshold voltages, wherein (i) data considered hot-read data is written using a first voltage threshold, (ii) data not considered hot-read data is written using a second voltage threshold, and (iii) the first voltage threshold reduces an impact on endurance of the memory.

* * * * *